United States Patent
Hirata et al.

(10) Patent No.: US 10,680,571 B2
(45) Date of Patent: Jun. 9, 2020

(54) CONDUCTIVE PATH WITH NOISE FILTER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Keiji Hirata, Mie (JP); Takeshi Aizawa, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-shi, Osaka (JP)

( * ) Notice: Subject to any disclaimer, the term of this patent is extended or adjusted under 35 U.S.C. 154(b) by 138 days.

(21) Appl. No.: 15/744,463

(22) PCT Filed: Aug. 27, 2015

(86) PCT No.: PCT/JP2015/074240
§ 371 (c)(1),
(2) Date: Jan. 12, 2018

(87) PCT Pub. No.: WO2017/013809
PCT Pub. Date: Jan. 26, 2017

(65) Prior Publication Data
US 2018/0205357 A1    Jul. 19, 2018

(30) Foreign Application Priority Data
Jul. 21, 2015  (JP) .................. 2015-143822

(51) Int. Cl.
*H03H 7/01*    (2006.01)
*H03H 1/00*    (2006.01)
(Continued)

(52) U.S. Cl.
CPC ....... *H03H 7/0115* (2013.01); *B60R 16/0207* (2013.01); *H01B 7/0018* (2013.01);
(Continued)

(58) Field of Classification Search
CPC ........... H03H 2001/005; H03H 1/0007; H03H 7/0115
(Continued)

(56) References Cited

U.S. PATENT DOCUMENTS 5,701,665 A * 12/1997 Kling ................. H01R 13/7197
29/825

FOREIGN PATENT DOCUMENTS

JP    H06-338419 A    12/1994
JP    2004-342526 A    12/2004
(Continued)

OTHER PUBLICATIONS

Search Report for PCT/JP2015/074240, dated Sep. 29, 2015.

*Primary Examiner* — Rakesh B Patel
(74) *Attorney, Agent, or Firm* — Honigman LLP

(57) ABSTRACT

A conductive path with noise filter that enables an effective reduction in a surge noise in a specific frequency band is provided. A conductive path with noise filter includes conductive path main, an insulating holder, inductors provided in the holder, receiving terminal fittings provided in the holder, insertion-side terminal fittings capable of being fitted to the receiving terminal fittings, a U-phase capacitor provided between the U-phase wire and the U-phase insertion-side terminal fitting, a V-phase capacitor provided between the V-phase wire and the V-phase insertion-side terminal fitting, and a W-phase capacitor provided between the W-phase wire and the W-phase insertion-side terminal fitting.

11 Claims, 4 Drawing Sheets

(51) Int. Cl.
*B60R 16/02* (2006.01)
*H01B 7/00* (2006.01)
*H03H 7/09* (2006.01)

(52) U.S. Cl.
CPC ............ *H03H 1/0007* (2013.01); *H03H 7/01* (2013.01); *H03H 7/09* (2013.01); *H03H 2001/0021* (2013.01)

(58) Field of Classification Search
USPC ................................................ 333/182, 183
See application file for complete search history.

(56) References Cited

FOREIGN PATENT DOCUMENTS

| | | | |
|---|---|---|---|
| JP | 2007-335277 | A | 12/2007 |
| JP | 2013-110580 | A | 6/2013 |
| JP | 2014-207649 | A | 10/2014 |
| JP | 2015-020544 | A | 2/2015 |

\* cited by examiner

CONDUCTIVE PATH WITH NOISE FILTER

CROSS-REFERENCE TO RELATED APPLICATIONS

This application is the U.S. national stage of PCT/JP2015/074240 filed Aug. 27, 2015, which claims priority of Japanese Patent Application No. JP 2015-143822, filed Jul. 21, 2015.

TECHNICAL FIELD

The present invention relates to a conductive path with noise filter.

BACKGROUND

JP 2010-126043A discloses a technique in which a wire harness including three-phase AC wires is arranged between a motor and an inverter device in an electric vehicle, the wire harness is surrounded by a braided wire in order to take a measure against noise produced by the wire harness, and the two ends of the braided wire are connected to a shielding case of the motor and a shielding case of the inverter device. Using the braided wire to shield the wire harness in this manner makes it possible to prevent noise produced by the motor, the inverter device, and the wire harness from affecting surrounding devices or circuits.

However, using this method of surrounding a wire harness with a braided wire, it is difficult to effectively reduce surge noise in a specific frequency band produced by the inverter device.

The present invention was accomplished based on the above-mentioned circumstances, and it is an object thereof to provide a conductive path with noise filter that enables an effective reduction in surge noise in a specific frequency band.

SUMMARY

A conductive path with noise filter of the first invention includes: a conductive path main body; an insulating holder; an inductor provided in the holder; a receiving terminal fitting provided in the holder; an insertion-side terminal fitting capable of being fitted to the receiving terminal fitting; and a capacitor provided between the conductive path main body and the insertion-side terminal fitting and connected to the insertion-side terminal fitting, wherein the inductor is a tubular magnetic core and is arranged to be coaxial with the receiving terminal fitting, and a central hole of the inductor serves as a guide hole through which the insertion-side terminal fitting is passed and that prevents the insertion-side terminal fitting from being inclined.

A conductive path with noise filter of the second invention includes: a plurality of conductive path main bodies arranged in parallel; an insulating holder; receiving terminal fittings provided in the holder; insertion-side terminal fittings capable of being fitted to the receiving terminal fittings; capacitors provided between the conductive path main bodies and the insertion-side terminal fittings and connected to the insertion-side terminal fittings; and inductors provided in the holder and constituted by tubular magnetic cores through which the insertion-side terminal fittings are passed, wherein positioning holes through which the plurality of the conductive path main bodies are respectively passed are formed in the holder.

A conductive path with noise filter of the third invention includes: a plurality of conductive path main bodies arranged in parallel; an insulating holder; inductors provided in the holder; receiving terminal fittings provided in the holder; insertion-side terminal fittings capable of being fitted to the receiving terminal fittings; and capacitors provided between the conductive path main bodies and the insertion-side terminal fittings and connected to the insertion-side terminal fittings, wherein the inductors are connected to the receiving terminal fittings, and positioning holes through which the plurality of the conductive path main bodies are respectively passed are formed in the holder.

Advantageous Effects of Invention

With the first to third inventions, setting the electrostatic capacitance of the capacitor, setting the inductance of the inductor, and fitting the insertion-side terminal fitting to the receiving terminal fitting make it possible to effectively reduce surge noise in a specific frequency band due to LC resonance. A circuit on the inductor side and a circuit on the capacitor side can be connected simply by fitting the insertion-side terminal fitting to the receiving terminal fitting, and therefore, a complicated connecting operation such as soldering is unnecessary.

The conductive path with noise filter of the first invention has a configuration in which the inductor is a tubular magnetic core and is arranged to be coaxial with the receiving terminal fitting, and a central hole of the inductor serves as a guide hole through which the receiving terminal fitting is passed and that prevents the receiving terminal fitting from being inclined. With this configuration, the inductor exhibits a function of preventing the orientation of the insertion-side terminal fitting from inclining during a process for fitting the insertion-side terminal fitting to the receiving terminal fitting, thus making it possible to reliably fit the insertion-side terminal fitting to the receiving terminal fitting.

With the first and second inventions, the inductor is a tubular magnetic core, and therefore, the size can be reduced compared with a case where the inductor is constituted by a coil.

The conductive paths with noise filter of the second and third invention have a configuration in which a plurality of the conductive path main bodies are arranged in parallel, and positioning holes through which the plurality of the conductive path main bodies are respectively passed are formed in the holder. With this configuration, the plurality of the conductive path main bodies can be respectively passed through the corresponding positioning holes and thus positioned.

DETAILED DESCRIPTION OF PREFERRED EMBODIMENTS (a) The conductive path with noise filter of the first invention may also have a configuration in which a plurality of the conductive path main bodies are arranged in parallel, and positioning holes through which the plurality of the conductive path main bodies are respectively passed are formed in the holder.

With this configuration, the plurality of the conductive path main bodies can be respectively passed through the corresponding positioning holes and thus positioned.

(b) The conductive paths with noise filter of the first to third inventions may also have a configuration in which a tubular shielding layer surrounds a plurality of the conductive path main bodies all together.

With this configuration, the shielding layer surrounds the conductive path main bodies, thus making it possible to also prevent surge noise from affecting surrounding devices or circuits.

(c) The conductive paths with noise filter of the first to third inventions according to (b) may also have a configuration in which the capacitors are arranged inside a shielded space surrounded by the shielding layer.

With this configuration, the size can be reduced compared with a case where the capacitors are provided on the outside of the shielding layer.

(d) The conductive paths with noise filter of the first to third inventions may also have a configuration in which the capacitor includes the conductive path main body, an insulating layer surrounding the conductive path main body, and a conductive layer corresponding to the conductive path main body with the insulating layer being sandwiched between the conductive layer and the conductive path main body.

With this configuration, a lead wire becomes unnecessary for the capacitor, thus making it unnecessary to connect the conductive path main body and a lead wire.

Embodiment 1

Figure 1:
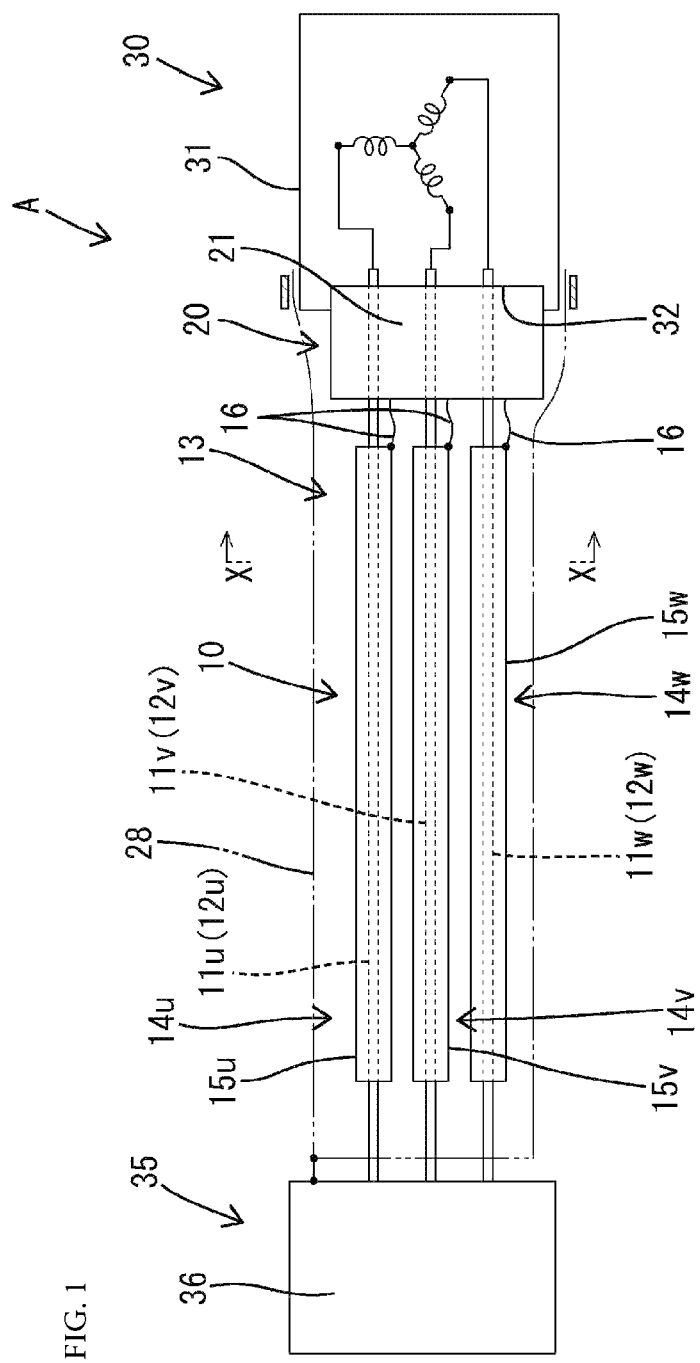
FIG. 1 is a configuration diagram of a conductive path with noise filter of Embodiment 1.
Figure 2:
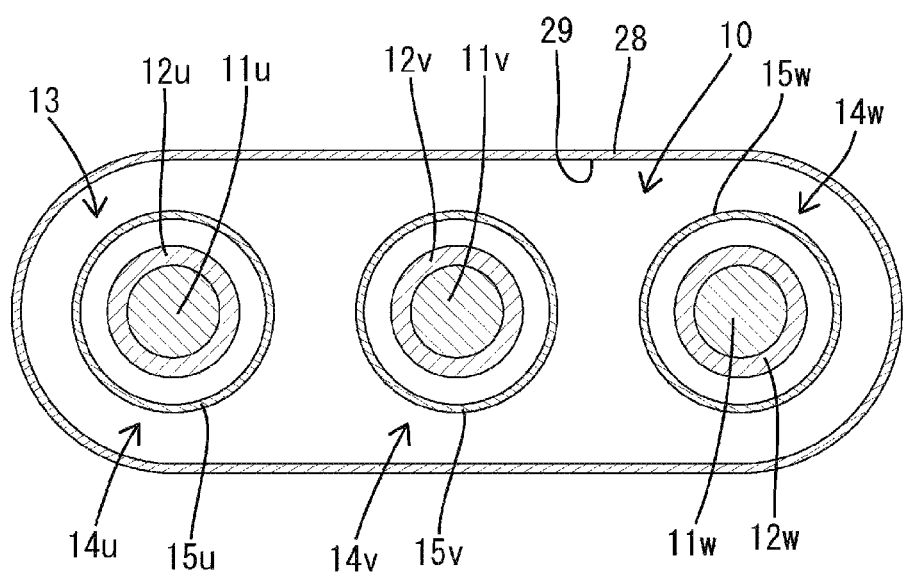
FIG. 2 is a cross-sectional view taken along line X-X in FIG. 1.
Figure 3:
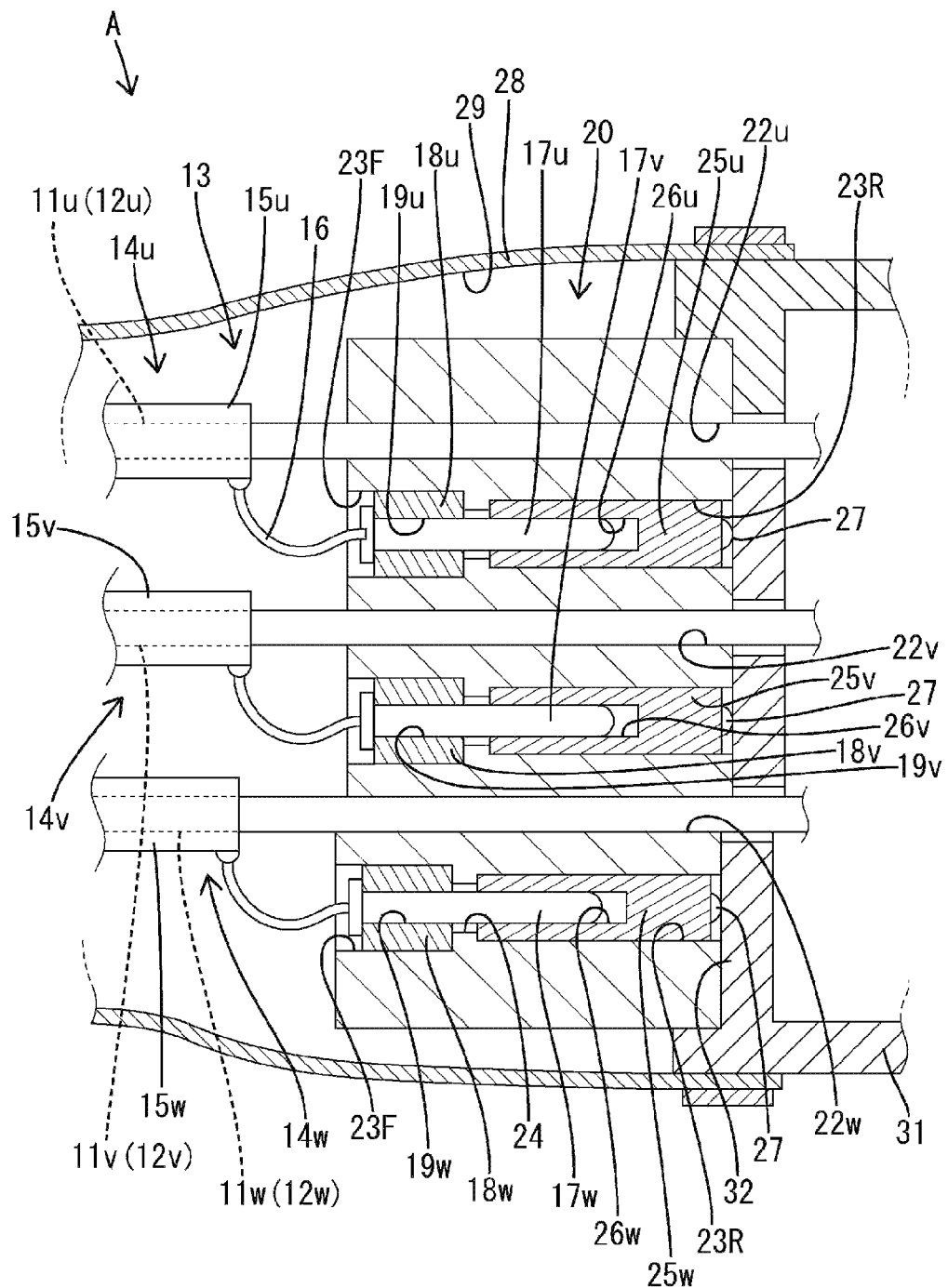
FIG. 3 is an enlarged cross-sectional view of a filter connection module included in the conductive path with noise filter.

Hereinafter, Embodiment 1 in which the present invention is embodied will be described with reference to FIGS. 1 to 3. A conductive path A with noise filter of Embodiment 1 is arranged between a motor 30 and an inverter device 35 mounted in an electric vehicle such as an electric car or a hybrid car. The conductive path A with noise filter includes: a U-phase wire 11$u$ ("conductive path main body" in the claims), a V-phase wire 11$v$ ("conductive path main body" in the claims), and a W-phase wire 11$w$ ("conductive path main body" in the claims) that constitute a three-phase AC circuit 10; a surge reducing filter 13; a filter connection module 20; and a shielding layer 28.

The U-phase wire 11$u$, the V-phase wire 11$v$, and the W-phase wire 11$w$ are each constituted by a stranded wire or a single-core wire made of metal (e.g., copper, a copper alloy, aluminum, or an aluminum alloy). The outer circumference of the U-phase wire 11$u$ is surrounded by a U-phase insulating coating 12$u$ ("insulating layer" in the claims) made of a synthetic resin. The outer circumference of the V-phase wire 11$v$ is surrounded by a V-phase insulating coating 12$v$ ("insulating layer" in the claims) made of a synthetic resin. The outer circumference of the W-phase wire 11$w$ is surrounded by a W-phase insulating coating 12$w$ ("insulating layer" in the claims) made of a synthetic resin. Specifically, the U-phase wire 11$u$ and the U-phase insulating coating 12$u$ make up one coated electric wire. The V-phase wire 11$v$ and the V-phase insulating coating 12$v$ make up one coated electric wire. The W-phase wire 11$w$ and the W-phase insulating coating 12$w$ make up one coated electric wire.

The U-phase wire 11$u$, the V-phase wire 11$v$, and the W-phase wire 11$w$ are arranged in parallel. One end of each of the U-phase wire 11$u$, the V-phase wire 11$v$, and the W-phase wire 11$w$ is connected to an inverter circuit (not shown) of the inverter device 35. The inverter circuit is accommodated inside the conductive inverter case 36, which has a shielding function. The other end of each of the U-phase wire 11$u$, the V-phase wire 11$v$, and the W-phase wire 11$w$ is connected to the windings of the motor 30. The windings are accommodated inside the conductive motor case 31, which has a shielding function.

The surge reducing filter 13 includes a U-phase capacitor 14$u$ ("capacitor" in the claims), a V-phase capacitor 14$v$ ("capacitor" in the claims), and a W-phase capacitor 14$w$ ("capacitor" in the claims) The U-phase capacitor 14$u$ has a configuration in which a tubular U-phase conductive layer 15$u$ ("conductive layer" in the claims) surrounds the U-phase wire 11$u$ and the U-phase insulating coating 12$u$. Specifically, the positional relationship between the U-phase conductive layer 15$u$ and the U-phase wire 11$u$ is such that the U-phase conductive layer 15$u$ and the U-phase wire 11$u$ are in proximity to each other and face each other with the U-phase insulating coating 12$u$ being sandwiched therebetween. Accordingly, the U-phase wire 11$u$, the U-phase insulating coating 12$u$, and the U-phase conductive layer 15$u$ constitute the U-phase capacitor 14$u$, and the U-phase wire 11$u$ and the U-phase conductive layer 15$u$ serve as electrodes. The U-phase conductive layer 15$u$ is constituted by a sheet-like or tape-like metal foil made of copper, a copper alloy, aluminum, an aluminum alloy, or the like. The outer circumference of the U-phase conductive layer 15$u$ is coated with an insulating coating, an insulating film, or the like.

The V-phase capacitor 14$v$ has a configuration in which a tubular V-phase conductive layer 15$v$ ("conductive layer" in the claims) surrounds the V-phase wire 11$v$ and the V-phase insulating coating 12$v$. Specifically, the positional relationship between the V-phase conductive layer 15$v$ and the V-phase wire 11$v$ is such that the V-phase conductive layer 15$v$ and the V-phase wire 11$v$ are in proximity to each other and face each other with the V-phase insulating coating 12$v$ being sandwiched therebetween. Accordingly, the V-phase wire 11$v$, the V-phase insulating coating 12$v$, and the V-phase conductive layer 15$v$ constitute the V-phase capacitor 14$v$, and the V-phase wire 11$v$ and the V-phase conductive layer 15$v$ serve as electrodes. The V-phase conductive layer 15$v$ is also constituted by a metal foil in the same manner as the U-phase conductive layer 15$u$. The outer circumference of the V-phase conductive layer 15$v$ is coated with an insulating coating, an insulating film, or the like.

The W-phase capacitor 14$w$ has a configuration in which a tubular W-phase conductive layer 15$w$ ("conductive layer" in the claims) surrounds the W-phase wire 11$w$ and the W-phase insulating coating 12$w$. Specifically, the positional relationship between the W-phase conductive layer 15$w$ and the W-phase wire 11$w$ is such that the W-phase conductive layer 15$w$ and the W-phase wire 11$w$ are in proximity to each other and face each other with the W-phase insulating coating 12$w$ being sandwiched therebetween. Accordingly, the W-phase wire 11$w$, the W-phase insulating coating 12$w$, and the W-phase conductive layer 15$w$ constitute the W-phase capacitor 14$w$, and the W-phase wire 11$w$ and the W-phase conductive layer 15$w$ serve as electrodes. The W-phase conductive layer 15$w$ is also constituted by a metal foil in the same manner as the U-phase conductive layer 15$u$.

The outer circumference of the W-phase conductive layer 15w is coated with an insulating coating, an insulating film, or the like.

A U-phase insertion-side terminal fitting 17u is connected to an end on the motor 30 side of the U-phase conductive layer 15u via a flexible and conductive connection wire 16. A V-phase insertion-side terminal fitting 17v is connected to an end on the motor 30 side of the V-phase conductive layer 15v via a flexible and conductive connection wire 16. A W-phase insertion-side terminal fitting 17w is connected to an end on the motor 30 side of the W-phase conductive layer 15w via a flexible and conductive connection wire 16. These insertion-side terminal fittings 17u, 17v and 17w are included in the filter connection module 20.

The surge reducing filter 13 includes a U-phase inductor 18u ("inductor" in the claims), a V-phase inductor 18v ("inductor" in the claims), and a W-phase inductor 18w ("inductor" in the claims) in addition to the above-mentioned capacitors 14u, 14v and 14w. Each of these inductors 18u, 18v and 18w is constituted by a cylindrical magnetic core (e.g., ferrite core). A central hole of the U-phase inductor 18u is formed as a U-phase guide hole 19u in the form of a through hole for guiding the U-phase insertion-side terminal fitting 17u, which will be described later. A central hole of the V-phase inductor 18v is formed as a V-phase guide hole 19v in the form of a through hole for guiding the V-phase insertion-side terminal fitting 17v, which will be described later. A central hole of the W-phase inductor 18w is formed as a W-phase guide hole 19w in the form of a through hole for guiding the W-phase insertion-side terminal fitting 17w, which will be described later. An insulating layer (not shown) is formed on the inner circumference of each of the guide holes 19u, 19v and 19w. It should be noted that, when it is unnecessary to insulate the inductors 18u, 18v and 18w from the terminal fittings 17u, 17v and 17w, the insulating layers need not be provided.

The filter connection module 20 includes: an insulating holder 21 (made of a synthetic resin); and the U-phase inductor 18u, the V-phase inductor 18v, and the W-phase inductor 18w included in the surge reducing filter 13. The holder 21 is attached to a front wall 32 of the motor case 31 in an intimate contact state.

In the holder 21, a U-phase positioning hole 22u ("positioning hole" in the claims), a V-phase positioning hole 22v ("positioning hole" in the claims), and a W-phase positioning hole 22w ("positioning hole" in the claims) are formed in the form of through holes that are formed through the holder 21 from its front surface to its rear surface. The U-phase wire 11u is passed through the U-phase positioning hole 22u, the V-phase wire 11v is passed through the V-phase positioning hole 22v, and W-phase wire 11w is passed through the W-phase positioning hole 22w.

Three front accommodating chambers 23F that have openings in the front surface (surface opposite to the front wall 32 of the motor case 31) of the holder 21 are formed in the holder 21. Also, three rear accommodating chambers 23R that are located on the rear side with respect to the three front accommodating chambers 23F and have openings in the rear surface (surface opposed to the front wall 32 of the motor case 31) of the holder 21 are formed in the holder 21. The rear ends of the three front accommodating chambers 23F coaxially correspond to the front ends of the three rear accommodating chambers 23R via communication holes 24, and are lined up in the front-rear direction.

The U-phase inductor 18u, the V-phase inductor 18v, and the W-phase inductor 18w are accommodated in the three front accommodating chambers 23F and fixed thereto. A U-phase receiving terminal fitting 25u ("receiving terminal fitting" in the claims), a V-phase receiving terminal fitting 25v ("receiving terminal fitting" in the claims), and W-phase receiving terminal fitting 25w ("receiving terminal fitting" in the claims) that are included in the filter connection module 20 are accommodated in the three rear accommodating chambers 23R and fixed thereto.

A U-phase connection hole 26u that has an opening in the front end surface of the U-phase receiving terminal fitting 25u is formed in the U-phase receiving terminal fitting 25u. The U-phase connection hole 26u and the U-phase guide hole 19u are coaxial with each other and lined up in the front-rear direction. A V-phase connection hole 26v that has an opening in the front end surface of the V-phase receiving terminal fitting 25v is formed in the V-phase receiving terminal fitting 25v. The V-phase connection hole 26v and the V-phase guide hole 19v are coaxial with each other and lined up in the front-rear direction. A W-phase connection hole 26w that has an opening in the front end surface of the W-phase receiving terminal fitting 25w is formed in the W-phase receiving terminal fitting 25w. The W-phase connection hole 26w and the W-phase guide hole 19w are coaxial with each other and lined up in the front-rear direction.

Contact portions 27 that come into contact with the front surface of the front wall 32 in a state in which the holder 21 is fixed to the motor case 31 are formed on the rear end surfaces of the receiving terminal fittings 25u, 25v and 25w. Accordingly, the three receiving terminal fittings 25u, 25v and 25w are connected to the front wall 32 of the motor case 31 such that electrical conduction is established.

The shielding layer 28 is a tubular metal member constituted by a braided wire or the like, for example. One end of the shielding layer 28 is adhered to the outer periphery of the front end portion of the motor case 31 such that electrical conduction is established. The other end of the shielding layer 28 is located near the inverter device 35 and connected to the inverter case 36 such that electrical conduction is established. A space surrounded by the shielding layer 28 serves as a shielded space 29. The shielding layer 28 surrounds the U-phase wire 11u, the V-phase wire 11v, the W-phase wire 11w, the U-phase capacitor 14u, the V-phase capacitor 14v, the W-phase capacitor 14w, and the holder 21 (filter connection module 20) attached to the front wall 32. In other words, the U-phase wire 11u, the V-phase wire 11v, the W-phase wire 11w, the three capacitors 14u, 14v and 14w, and the filter connection module 20 are accommodated inside the shielded space 29.

Next, the functions of Embodiment 1 will be described. The assembly of the conductive path A with noise filter and the connection thereof to the motor 30 and the inverter device 35 are performed according to the following procedure. The U-phase conductive layer 15u, the V-phase conductive layer 15v, and the W-phase conductive layer 15w are respectively attached to the U-phase wire 11u, the V-phase wire 11v, and the W-phase wire 11w, and the insertion-side terminal fittings 17u, 17v and 17w are respectively connected to the conductive layers 15u, 15v and 15w. Next, the U-phase wire 11u, the V-phase wire 11v, and the W-phase wire 11w are respectively inserted into the U-phase positioning hole 22u, the V-phase positioning hole 22v, and the W-phase positioning hole 22w of the holder 21, and connected to the windings (not shown) in the motor 30.

Thereafter, the holder 21 is attached to the front wall 32 of the motor case 31, and the insertion-side terminal fittings 17u, 17v and 17w are fitted to the corresponding receiving terminal fittings 25u, 25v and 25w. When fitted thereto, the insertion-side terminal fittings 17u, 17v and 17w are fitted into the guide holes 19u, 19v and 19w of the respective inductors 18u, 18v and 18w. The insertion-side terminal fittings 17u, 17v and 17w are guided by the guide holes 19u, 19v and 19w, and thus held in a predetermined orientation. In addition, the insertion-side terminal fittings 17u, 17v and 17w are positioned corresponding to the receiving terminal fittings 25u, 25v and 25w, and fitted into the connection holes 26u, 26v and 26w of the respective receiving terminal fittings 25u, 25v and 25w in such a state.

In this manner, the U-phase insertion-side terminal fitting 17u and the U-phase receiving terminal fitting 25u are connected to each other, the V-phase insertion-side terminal fitting 17v and the V-phase receiving terminal fitting 25v are connected to each other, and the W-phase insertion-side terminal fitting 17w and the W-phase receiving terminal fitting 25w are connected to each other. It should be noted that the connection of the insertion-side terminal fittings 17u, 17v and 17w to the receiving terminal fittings 25u, 25v and 25w, and the attachment of the holder 21 to the front wall 32 may be performed in any order. Thereafter, the shielding layer 28 is connected to the motor case 31 and the inverter case 36, and thus the assembly of the conductive path A with noise filter and the connection thereof to the motor 30 and the inverter device 35 are completed.

To lower a surge voltage produced by the inverter device 35, the frequency of the surge voltage is determined. Then, the electrostatic capacitances of the capacitors 14u, 14v and 14w suitable for reducing surge noise at the determined frequency are set by changing, in accordance with the frequency, the lengths of the conductive layers 15u, 15v and 15w, the corresponding areas of the conductive layers 15u, 15v and 15w and the U-phase wire 11u, V-phase wire 11v and W-phase wire 11w, the distances between the conductive layers 15u, 15v and 15w and the U-phase wire 11u, V-phase wire 11v and W-phase wire 11w, the materials for the insulating coatings 12u, 12v and 12w, and the like. Regarding the inductors 18u, 18v and 18w as well, the materials for the magnetic cores and the cross-sectional areas and lengths of the magnetic cores are selected as appropriate, and inductors 18u, 18v and 18w with inductances suitable for reducing surge noise at the determined frequency are selected.

When the electrostatic capacitances of the capacitors 14u, 14v and 14w, and the inductances of the inductors 18u, 18v and 18w are set in this manner, a surge current at a specific frequency flows into the motor case 31 via the connection wires 16, the insertion-side terminal fittings 17u, 17v and 17w, and the receiving terminal fittings 25u, 25v and 25w, and returns to the inverter device 35 via the shielding layer 28, resulting in a reduction of the surge noise.

The shielding layer 28 surrounds the conductive path main bodies (the U-phase wire 11u, the V-phase wire 11v, the W-phase wire 11w) all together. The motor case 31 and the inverter case 36 are connected to each other by the shielding layer 28. It should be noted that a conductive means for connecting the motor case 31 and the inverter case 36 is not limited to the shielding layer 28, and a stranded wire, a single-core wire, a vehicle body, or the like may also be used.

The conductive path A with noise filter of Embodiment 1 includes the conductive path main bodies (the U-phase wire 11u, the V-phase wire 11v, and the W-phase wire 11w), the insulating holder 21, the inductors 18u, 18v and 18w provided in the holder 21, the receiving terminal fittings 25u, 25v and 25w provided in the holder 21, the insertion-side terminal fittings 17u, 17v and 17w capable of being fitted to the receiving terminal fittings 25u, 25v and 25w, and the capacitors 14u, 14v and 14w provided between the conductive path main bodies (the U-phase wire 11u, the V-phase wire 11v, and the W-phase wire 11w) and the insertion-side terminal fittings 17u, 17v and 17w.

The electrostatic capacitances of the capacitors 14u, 14v and 14w are set by changing the lengths of the conductive layers 15u, 15v and 15w included in the capacitors 14u, 14v and 14w, the corresponding areas of the conductive layers 15u, 15v and 15w and the U-phase wire 11u, V-phase wire 11v and W-phase wire 11w, the distances between the conductive layers 15u, 15v and 15w and the U-phase wire 11u, V-phase wire 11v and W-phase wire 11w, the materials for the insulating coatings 12u, 12v and 12w, and the like. The inductances of the inductors 18u, 18v and 18w are set as appropriate. This makes it possible to effectively reduce surge noise in a specific frequency band due to LC resonance.

In the filter connection module 20, the circuit on the inductors 18u, 18v and 18w side and the circuit on the capacitors 14u, 14v and 14w can be connected simply by fitting the insertion-side terminal fittings 17u, 17v and 17w to the receiving terminal fittings 25u, 25v and 25w. Therefore, a complicated connecting operation such as soldering is unnecessary.

The inductors 18u, 18v and 18w are tubular magnetic cores, and therefore, their size can be reduced compared with a case where the inductors are constituted by coils. The inductors 18u, 18v and 18w are arranged to be coaxial with the receiving terminal fittings 25u, 25v and 25w at positions at which the insertion-side terminal fittings 17u, 17v and 17w can be passed through the inductors 18u, 18v and 18w. With this configuration, the inductors 18u, 18v and 18w exhibit a function of preventing the orientations of the insertion-side terminal fittings 17u, 17v and 17w from inclining during a process for fitting the insertion-side terminal fittings 17u, 17v and 17w to the receiving terminal fittings 25u, 25v and 25w, thus making it possible to reliably fit the insertion-side terminal fittings 17u, 17v and 17w to the receiving terminal fittings 25u, 25v and 25w.

The three conducive path main bodies (the U-phase wire 11u, the V-phase wire 11v, the W-phase wire 11w) are arranged in parallel, and the positioning holes 22u, 22v and 22w through which the three conductive path main bodies (the U-phase wire 11u, the V-phase wire 11v, the W-phase wire 11w) are respectively passed are formed in the holder 21. With this configuration, the three conductive path main bodies (the U-phase wire 11u, the V-phase wire 11v, the W-phase wire 11w) are passed through the corresponding positioning holes 22u, 22v and 22w and thus positioned.

The tubular shielding layer 28 surrounds the three conductive path main bodies (the U-phase wire 11u, the V-phase wire 11v, the W-phase wire 11w) all together, thus making it possible to prevent surge noise from affecting surrounding devices or circuits. The capacitors 14u, 14v and 14w are arranged inside the shielded space 29 surrounded by the shielding layer 28, thus making it possible to reduce the size compared with the case where the capacitors 14u, 14v and 14w are provided on the outside of the shielding layer 28.

Each of the capacitors 14u, 14v and 14w includes the conductive path main body (the U-phase wire 11u, the V-phase wire 11v, the W-phase wire 11w), the insulating layer (the U-phase insulating coating 12u, the W-phase insulating coating 12v, the W-phase insulating coating 12w) surrounding the conductive path main body (the U-phase wire 11u, the V-phase wire 11v, the W-phase wire 11w), and the conductive layer (the U-phase conductive layer 15u, the V-phase conductive layer 15v, the W-phase conductive layer 15w) corresponding to the conductive path main body (the U-phase wire 11u, the V-phase wire 11v, the W-phase wire 11w) with the insulating layer (the U-phase insulating coating 12u, the W-phase insulating coating 12v, the W-phase insulating coating 12w) being sandwiched between the conductive layer (the U-phase conductive layer 15u, the V-phase conductive layer 15v, the W-phase conductive layer 15w) and the conductive path main body (the U-phase wire 11u, the V-phase wire 11v, the W-phase wire 11w). With this configuration, lead wires become unnecessary for the capacitors 14u, 14v and 14w, thus making it unnecessary to connect the conductive path main bodies (the U-phase wire 11u, the V-phase wire 11v, and the W-phase wire 11w) and the lead wires.

Embodiment 2

Figure 4:
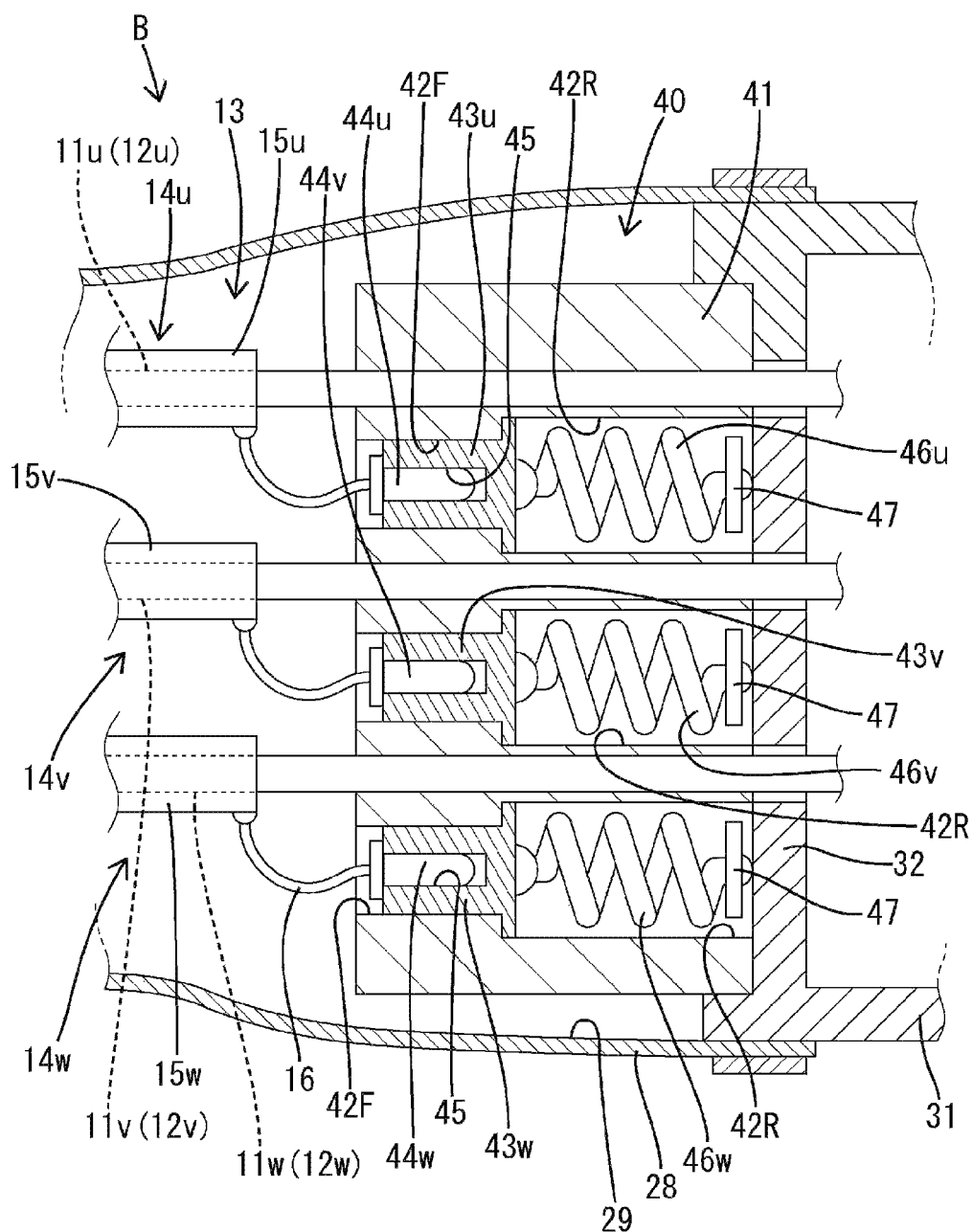
FIG. 4 is an enlarged cross-sectional view of a filter connection module included in a conductive path with noise filter of Embodiment 2.

Next, Embodiment 2 in which the present invention is embodied will be described with reference to FIG. 4. A conductive path B with noise filter of Embodiment 2 has a configuration that differs from that of Embodiment 1 above in that a filter connection module 40 is used. Other structural aspects are identical to those of Embodiment 1 above. Therefore, identical structural aspects are denoted by identical reference numerals, and descriptions of these structures, functions, and effects are omitted.

In the filter connection module 40 of Embodiment 2, the rear ends of three front accommodating chambers 42F and the front ends of three rear accommodating chambers 42R are directly in communication. A U-phase receiving terminal fitting 43u, a V-phase receiving terminal fitting 43v, and a W-phase receiving terminal fitting 43w are respectively attached to the three front accommodating chambers 42F. Connection holes 45 to which a U-phase insertion-side terminal fitting 44u, a V-phase insertion-side terminal fitting 44v, and a W-phase insertion-side terminal fitting 44w are fitted are formed in these receiving terminal fittings 43u, 43v and 43w.

While tubular magnetic cores are used as the inductors 18u, 18v and 18w of Embodiment 1 above, each of a U-phase inductor 46u, a V-phase inductor 46v, and a W-phase inductor 46w of Embodiment 2 is obtained by shaping a metal single-core wire (not shown) whose outer circumference is coated with an insulating layer (not shown) into a coil shape. These three inductors 46u, 46v and 46w are accommodated in the three rear accommodating chambers 42R. The front ends of the inductors 46u, 46v and 46w are adhered to the rear end surfaces of the receiving terminal fittings 43u, 43v and 43w through welding or the like.

Contact members 47 that come into contact with the front surface of the front wall 32 in a state in which a holder 41 is attached to the front wall 32 of the motor case 31 are adhered to the rear ends of the inductors 46u, 46v and 46w. A surge current is thus discharged to the motor case 31 via the capacitors 14u, 14v and 14w, the insertion-side terminal fittings 44u, 44v and 44w, the receiving terminal fittings 43u, 43v and 43w, and the inductors 46u, 46v and 46w, thus making it possible to effectively reduce surge noise.

Other Embodiments

The present invention is not limited to the embodiments that have been described above with reference to the drawings, and embodiments such as those described below are also included in the technical scope of the present invention, for example.

Although, in Embodiments 1 and 2 above, each of the capacitors includes the conductive path main body, the insulating layer, and the conductive layer, the capacitor may also include a lead wire and have a configuration in which the lead wire is connected to the conductive path main body.

Although, in Embodiments 1 and 2 above, the shielding layer surrounds the plurality of conductive path main bodies all together, a configuration in which such a shielding layer is not provided may also be applied.

Although, in Embodiments 1 and 2 above, the three conductive path main bodies constituting the three-phase AC circuit are star-connected, the present invention can also be applied to a case where three conductive path main bodies constituting a three-phase AC circuit are delta-connected.

Although, in Embodiments 1 and 2 above, the three conductive path main bodies constitute the three-phase AC circuit, the present invention can also be applied to a case where the conductive path main bodies do not constitute a three-phase AC circuit.

Although, in Embodiments 1 and 2 above, the number of the conductive path main bodies is three, the present invention can also be applied to a case where the number of the conductive path main bodies is one, two, or four or more.

Although, in Embodiments 1 and 2 above, the flexible stranded wires having a circular cross section are used as the conductive path main bodies, busbars that are not deformed easily, flat cables in which a plurality of electric wires are arranged in parallel, or the like may also be used.

Although, in Embodiments 1 and 2 above, the three conductive path main bodies are respectively passed through the three positioning holes formed in the holder, the three conductive path main bodies may also be passed through one through hole formed in the holder together.

Although, in Embodiment 1 above, the inductors are arranged such that the insertion-side terminal fittings are passed through the inductors, the inductors may also be arranged at positions at which the insertion-side terminal fittings are not passed through the inductors.

Although, in Embodiments 1 and 2 above, the conductive path with noise filter is arranged between the motor and the inverter device, the present invention can also be applied to a case where the conductive path with noise filter is to be connected to devices other than the motor and the inverter device.

Although, in Embodiments 1 and 2 above, each of the conductive layers corresponds to the conductive path main body and surrounds the entire circumference thereof, each of the conductive layers may be configured to correspond to only a partial region of the conductive path main body in a circumferential direction.

Although, in Embodiments 1 and 2 above, the conductive layers are made of metal having a tubular shape, sheet-like or tape-like metal foils, braided wires, metal busbars, metal stranded wires, metal single-core wires, core materials with a plated surface, conductive resins, conductive rubbers, or the like may also be used.

The invention claimed is:

1. A conductive path with a noise filter comprising:
   a conductive path main body, wherein a plurality of the conductive path main bodies are arranged in parallel, and positioning holes through which the plurality of the conductive path main bodies are respectively passed are formed in the holder;
   an insulating holder;
   an inductor provided in the holder;

a receiving terminal fitting provided in the holder and spaced apart from the inductor, the positioning holes are not coaxially aligned with the receiving terminal fitting and the inductor;

an insertion-side terminal fitting capable of being fitted to the receiving terminal fitting; and a capacitor provided between the conductive path main body and the insertion-side terminal fitting and connected to the insertion-side terminal fitting, wherein the inductor is a tubular magnetic core and is arranged to be coaxial with the receiving terminal fitting, and a central hole of the inductor serves as a guide hole through which the insertion-side terminal fitting is passed through and that prevents the insertion-side terminal fitting from being inclined prior to being seated in the receiving terminal fitting.

2. The conductive path with noise filter according to claim 1, wherein a tubular shielding layer surrounds the plurality of the conductive path main bodies all together.

3. The conductive path with noise filter according to claim 2, wherein the capacitor is arranged inside a shielded space surrounded by the shielding layer.

4. The conductive path with noise filter according to claim 3,
wherein the capacitor comprises:
the conductive path main body,
an insulating layer surrounding the conductive path main body, and
a conductive layer corresponding to the conductive path main body with the insulating layer being sandwiched between the conductive layer and the conductive path main body.

5. The conductive path with noise filter according to claim 2,
wherein the capacitor comprises:
the conductive path main body,
an insulating layer surrounding the conductive path main body, and
a conductive layer corresponding to the conductive path main body with the insulating layer being sandwiched between the conductive layer and the conductive path main body.

6. The conductive path with noise filter according to claim 1,
wherein the capacitor comprises:
the conductive path main body;
an insulating layer surrounding the conductive path main body: and
a conductive layer corresponding to the conductive path main body with the insulating layer being sandwiched between the conductive layer and the conductive path main body.

7. A conductive path with noise filter comprising:
a plurality of conductive path main bodies arranged in parallel;
an insulating holder;
receiving terminal fittings provided in the holder, the receiving terminal fittings having a closed end disposed within the holder;
insertion-side terminal fittings capable of being fitted to the receiving terminal fittings so as be seated entirely within the holder;
capacitors provided between the conductive path main bodies and the insertion-side terminal fittings and connected to the insertion-side terminal fittings; and
inductors provided in the holder and constituted by tubular magnetic cores through which the insertion-side terminal fittings are passed,
wherein positioning holes through which the plurality of the conductive path main bodies are respectively passed are formed in the holder, the positioning holes extending through a length of the holder and the positioning holes are parallel and spaced apart from the receiving terminal fittings.

8. The conductive path with noise filter according to claim 7,
wherein each of the capacitors comprises:
the conductive path main body,
an insulating layer surrounding the conductive path main body, and
a conductive layer corresponding to the conductive path main body with the insulating layer being sandwiched between the conductive layer and the conductive path main body.

9. The conductive path with noise filter according to claim 7, wherein a tubular shielding layer surrounds the plurality of the conductive path main bodies all together.

10. A conductive path with noise filter comprising:
a plurality of conductive path main bodies arranged in parallel;
an insulating holder;
inductors provided in the holder;
receiving terminal fittings provided in the holder, the receiving terminal fittings having a closed end disposed within the holder;
insertion-side terminal fittings capable of being fitted to the receiving terminal fittings so as be seated entirely within the holder; and
capacitors provided between the conductive path main bodies and the insertion-side terminal fittings and connected to the insertion-side terminal fittings,
wherein the inductors are connected to the receiving terminal fittings, and
positioning holes through which the plurality of the conductive path main bodies are respectively passed are formed in the holder, the positioning holes extending through a length of the holder and the positioning holes are parallel and spaced apart from the receiving terminal fittings.

11. The conductive path with noise filter according to claim 10,
wherein each of the capacitors comprises:
the conductive path main body,
an insulating layer surrounding the conductive path main body, and
a conductive layer corresponding to the conductive path main body with the insulating layer being sandwiched between the conductive layer and the conductive path main body.

* * * * *